US012805325B2

(12) United States Patent
Hua et al.

(10) Patent No.: US 12,805,325 B2
(45) Date of Patent: Nov. 17, 2026

(54) SEMICONDUCTOR DEVICE INCLUDING BARRIER STRUCTURE AND CEILING LAYER OVER AN ACTIVE DEVICE

(71) Applicant: WIN SEMICONDUCTORS CORP., Taoyuan City (TW)

(72) Inventors: Chang-Hwang Hua, Taoyuan City (TW); Chun-Han Song, Taoyuan City (TW); Rong-Hao Syu, Taoyuan City (TW); Hsi-Tsung Lin, Taoyuan City (TW); Shu-Hsiao Tsai, Taoyuan City (TW)

(73) Assignee: WIN SEMICONDUCTORS CORP., Taoyuan City (TW)

( * ) Notice: Subject to any disclaimer, the term of this patent is extended or adjusted under 35 U.S.C. 154(b) by 584 days.

(21) Appl. No.: 17/708,489

(22) Filed: Mar. 30, 2022

(65) Prior Publication Data

US 2023/0317633 A1 Oct. 5, 2023

(51) Int. Cl.
*H05K 3/30* (2026.01)
*H05K 3/10* (2006.01)
(Continued)

(52) U.S. Cl.
CPC .............. *H10W 42/00* (2026.01); *H10D 1/68* (2025.01); *H10D 84/811* (2025.01);
(Continued)

(58) Field of Classification Search
CPC . H01L 27/0629; H01L 28/40; H01L 27/0605; H01L 28/60; H01L 25/16; H01L 23/564; H01L 23/3171; H01L 23/481; H01L 23/3157; H01L 23/562; H01L 23/04; H01Q 1/2283; H01Q 1/2291; H01Q 1/242; H01Q 1/243; H01Q 1/38; H01Q 13/02; H01Q 13/10; H01Q 21/00; H01Q 21/08; H01Q 23/00; H01Q 3/40; H01Q 9/0421;
(Continued)

(56) References Cited

U.S. PATENT DOCUMENTS 5,962,970 A * 10/1999 Yokoi .................... H05B 33/12 313/506
6,037,712 A * 3/2000 Codama ............... H10K 50/844 428/917
(Continued)

FOREIGN PATENT DOCUMENTS

TW 201724475 A 7/2017
TW 202018894 A 5/2020
(Continued)

OTHER PUBLICATIONS

Chinese language office action dated Jul. 5, 2023, issued in application No. TW 112108040.

*Primary Examiner* — Leonard Chang
*Assistant Examiner* — Tsz K Chiu
(74) *Attorney, Agent, or Firm* — McClure, Qualey & Rodack, LLP

(57) ABSTRACT

A semiconductor chip includes an active device and a passive device formed over a substrate. A passivation layer covers the active device and the passive device. A barrier structure surrounds the active device. A ceiling layer is formed across the barrier structure over the active device. The ceiling layer has an opening exposing the barrier structure.

20 Claims, 13 Drawing Sheets

(51) Int. Cl.

*H10D 1/68* (2025.01)
*H10D 84/80* (2025.01)
*H10W 20/20* (2026.01)
*H10W 42/00* (2026.01)
*H10W 74/01* (2026.01)
*H10W 74/10* (2026.01)

(52) U.S. Cl.

CPC ........... *H10W 20/20* (2026.01); *H10W 74/01* (2026.01); *H10W 74/137* (2026.01)

(58) Field of Classification Search

CPC ......... H01Q 9/065; H01Q 9/28; H10W 90/00; H10W 40/22; H10W 40/228; H10W 44/20; H10W 72/0198; H10W 70/614; H10W 90/10; H10W 70/60; H10W 70/093; H10W 40/037; H10W 70/02; H10W 90/28; H10W 40/10; H10W 76/12; H10W 40/226; H10W 90/724; H10W 20/40; H10W 40/258; H10W 42/20; H10W 44/251; H10W 70/65; H10W 74/014; H10W 74/019; H10W 76/15; H10W 90/755; H10W 10/021; H10W 10/061; H10W 10/181; H10W 10/20; H10W 20/023; H10W 44/226; H10W 44/234; H10W 70/611; H10W 70/635; H10W 70/682; H10W 72/013; H10W 72/252; H10W 72/944; H10W 74/01; H10W 90/20; H10W 90/22; H10W 90/722; H10W 20/20; H10W 40/778; H10W 44/216; H10W 44/248; H10W 70/09; H10W 70/095; H10W 70/68; H10W 70/685; H10W 70/698; H10W 72/00; H10W 72/072; H10W 72/073; H10W 72/07354; H10W 72/241; H10W 72/29; H10W 72/347; H10W 72/877; H10W 72/9413; H10W 72/942; H10W 74/111; H10W 74/137; H10W 74/147; H10W 76/60; H10W 90/754; H10W 90/765; H10W 20/0234; H10W 20/0242; H10W 20/081; H10W 20/484; H10W 40/47; H10W 40/60; H10W 40/70; H10W 44/231; H10W 44/255; H10W 70/20; H10W 70/468; H10W 70/681; H10W 72/01; H10W 72/01235; H10W 72/016; H10W 72/071; H10W 72/07223; H10W 72/07232; H10W 72/07236; H10W 72/07254; H10W 72/07336; H10W 72/07352; H10W 72/07355; H10W 72/20; H10W 72/222; H10W 72/242; H10W 72/244; H10W 72/247; H10W 72/325; H10W 72/327; H10W 72/344; H10W 72/352; H10W 72/354; H10W 72/357; H10W 72/50; H10W 72/59; H10W 72/60; H10W 72/853; H10W 72/9415; H10W 74/00; H10W 74/117; H10W 74/15; H10W 76/10; H10W 76/134; H10W 80/743; H10W 90/288; H10W 90/297; H10W 90/701; H10W 90/734; H10W 90/736; H10W 90/753; H10W 99/00

See application file for complete search history.

(56) References Cited

U.S. PATENT DOCUMENTS 7,635,606 B2 12/2009 Warren et al.
7,902,083 B2 * 3/2011 Bedinger ............ H01L 23/5221 438/758
8,148,830 B2 * 4/2012 Bedinger ............... H05K 3/284 257/790
8,276,268 B2 * 10/2012 Kapusta ................. H05K 1/181 29/846
8,313,985 B2 * 11/2012 Hatcher, Jr. ........... H01L 23/291 257/788
8,492,908 B2 7/2013 Siomkos et al.
8,546,170 B2 * 10/2013 Traynor ............... H04R 19/005 438/51
8,571,239 B2 * 10/2013 Feiertag ............... H04R 1/2884 381/174
8,928,011 B2 * 1/2015 Tanada ................. H10K 50/824 313/503
9,023,678 B2 * 5/2015 Heo ....................... H10K 71/00 438/82
9,337,211 B2 * 5/2016 Kim .................... H01L 27/1218
9,478,591 B2 * 10/2016 Nam ................ H10K 59/80516
9,508,652 B1 * 11/2016 Herrault .............. H10W 70/614
9,548,472 B2 * 1/2017 Yang .................... H10K 50/813
9,632,487 B2 * 4/2017 Kim ................... H10K 59/1213
10,142,718 B2 * 11/2018 Minervini .............. G01K 13/00
10,158,212 B1 12/2018 Hua et al.
10,201,072 B2 * 2/2019 Kuk ..................... H05K 1/0218
10,205,122 B2 * 2/2019 Choi .................... H10K 50/844
10,477,687 B2 * 11/2019 Mun ...................... H05K 1/182
10,580,840 B2 * 3/2020 Kim ..................... H10K 50/844
10,594,020 B2 * 3/2020 Min ....................... H01Q 23/00
10,615,369 B2 * 4/2020 Choi .................... H10K 50/844
10,847,480 B2 * 11/2020 Tsai ...................... H10W 42/20
11,245,093 B2 * 2/2022 Sung .................... H10K 50/844
11,296,284 B2 * 4/2022 Seo ........................ H10K 71/80
11,302,662 B2 4/2022 Huang
11,521,935 B2 12/2022 Chen et al.
11,557,510 B2 1/2023 Yu et al.
11,610,947 B2 * 3/2023 Xie ...................... H10K 59/122
11,695,037 B2 * 7/2023 Lin ..................... H01L 23/3171 257/383
11,699,626 B2 7/2023 Oh et al.
2001/0014438 A1 * 8/2001 Tai ...................... F16K 99/0061 432/120
2003/0189206 A1 * 10/2003 Koyama .............. G09G 3/3283 257/59
2005/0032266 A1 * 2/2005 Suzuki .............. H01L 21/76804 438/50
2008/0116544 A1 * 5/2008 Grinman ........... H01L 21/76898 257/659
2009/0057844 A1 * 3/2009 Tanida .................. H01L 23/481 257/E21.597
2009/0280591 A1 * 11/2009 Hong ................... H10K 59/123 438/34
2011/0147768 A1 * 6/2011 Roberts ................ H10K 50/805 257/88
2013/0228790 A1 * 9/2013 Yamamura .......... H01L 29/7787 257/195
2014/0133282 A1 * 5/2014 Hamm ................. H10K 59/173 438/26
2014/0339517 A1 * 11/2014 Park ..................... H10K 59/873 257/40
2014/0374759 A1 * 12/2014 Kim ....................... H10K 59/00 438/34
2015/0021565 A1 * 1/2015 Min ................... H10K 59/8731 257/40
2015/0162564 A1 * 6/2015 Kodama .............. H10K 59/873 257/40
2015/0243846 A1 * 8/2015 Kwon ..................... H01L 33/62 257/99
2015/0250058 A1 * 9/2015 Ramachandran ...... H05K 1/185 361/748
2015/0277643 A1 * 10/2015 Kim ...................... G06F 1/1626 345/173
2015/0295075 A1 10/2015 Green et al.
2016/0043341 A1 * 2/2016 Heo ..................... H10K 59/122 438/23
2016/0149155 A1 * 5/2016 Kim ..................... H10K 59/124 438/23
2016/0190389 A1 * 6/2016 Lee ................... G02F 1/136277 438/28

(56) References Cited

U.S. PATENT DOCUMENTS

| | | | | |
|---|---|---|---|---|
| 2017/0018537 | A1* | 1/2017 | Shih | H10H 29/10 |
| 2017/0117229 | A1* | 4/2017 | Kumbhat | H10P 14/412 |
| 2017/0148856 | A1* | 5/2017 | Choi | H10K 59/873 |
| 2017/0330843 | A1* | 11/2017 | Hua | H01L 23/564 |
| 2018/0061907 | A1* | 3/2018 | Kim | H10K 59/38 |
| 2018/0123038 | A1 | 5/2018 | Lee et al. | |
| 2018/0151822 | A1* | 5/2018 | Kim | H10K 50/125 |
| 2018/0151831 | A1* | 5/2018 | Lee | H10K 50/81 |
| 2018/0351126 | A1* | 12/2018 | Choi | H10K 59/122 |
| 2019/0051859 | A1* | 2/2019 | Choi | H10K 59/1213 |
| 2019/0140212 | A1* | 5/2019 | Park | H10K 50/8426 |
| 2019/0148672 | A1* | 5/2019 | Seo | H10K 59/879 257/40 |
| 2019/0172898 | A1* | 6/2019 | Choi | H10K 50/822 |
| 2019/0288047 | A1* | 9/2019 | Jeong | H10K 50/8445 |
| 2019/0334120 | A1* | 10/2019 | Seo | H10K 71/00 |
| 2020/0006682 | A1* | 1/2020 | Seo | H10K 77/111 |
| 2020/0006700 | A1* | 1/2020 | Kim | H10K 59/87 |
| 2020/0006701 | A1* | 1/2020 | Lee | H10K 59/124 |
| 2020/0201392 | A1* | 6/2020 | Yu | G06F 3/04164 |
| 2021/0202329 | A1* | 7/2021 | Chen | H10W 76/12 |
| 2022/0359396 | A1 | 11/2022 | Wang et al. | |

FOREIGN PATENT DOCUMENTS

| | | | |
|---|---|---|---|
| TW | 202143426 | A | 11/2021 |
| TW | 202205597 | A | 2/2022 |
| TW | 202209495 | A | 3/2022 |
| TW | 202209620 | A | 3/2022 |

* cited by examiner

10c

SEMICONDUCTOR DEVICE INCLUDING BARRIER STRUCTURE AND CEILING LAYER OVER AN ACTIVE DEVICE

BACKGROUND

Technical Field

The present disclosure relates to semiconductor structure, and more particularly to semiconductor chip.

Description of the Related Art

Electronic components are integrally formed on a substrate. Such substrates typically include active devices and passive devices. Various factors make active devices different from passive devices, such as their functions, the nature of their energy, and their power gain. Active devices include transistors such as pseudomorphic high electron mobility transistors (pHEMT), metal-oxide semiconductor field effect transistors (MOSFETs), complementary metal-oxide semiconductor (CMOS) transistors, bipolar junction transistors (BJTs), laterally diffused MOS (LDMOS) transistors, high-voltage transistors, high-frequency transistors, and diodes. Passive devices include capacitors, resistors, and inductors.

With active devices and passive devices are integrated into a single chip, it is necessary to prevent the wafer from warping, and to provide sufficient moisture resistance to protect those devices.

Although existing semiconductor structure packaging technologies have generally been adequate for their intended purposes, they have not been entirely satisfactory in all respects, and need to be improved.

BRIEF SUMMARY

The present disclosure provides a semiconductor chip. The semiconductor chip includes an active device formed over a substrate. The semiconductor chip also includes a passive device formed over a substrate. The semiconductor chip also includes a passivation layer covering the active device and the passive device. The semiconductor chip also includes a barrier structure surrounding the active device. The semiconductor chip also includes a ceiling layer suspended on the barrier structure over the active device. The ceiling layer has an opening exposing the barrier structure.

The present disclosure also provides a semiconductor chip. The semiconductor chip includes an active device formed over a substrate. The semiconductor chip also includes a passive device formed over the substrate beside the active device. The semiconductor chip also includes a passivation layer formed over the active device and the passive device. The semiconductor chip also includes a barrier structure surrounding the active device and covering the passive device. The semiconductor chip also includes a ceiling layer formed over the barrier structure. The ratio of the area of the ceiling layer to the area of the semiconductor chip is in a range of about 2% to about 50%.

The present disclosure further provides a semiconductor chip. The semiconductor chip includes an active device, a passive device, and a pad structure formed over a substrate. The semiconductor chip also includes a barrier structure surrounding the active device. The semiconductor chip also includes a ceiling layer formed directly above the active device and over the barrier structure. The semiconductor chip also includes a via structure formed in the substrate.

The semiconductor chip also includes a metal stack conformally formed as the via structure and under the substrate.

A detailed description is given in the following embodiments with reference to the accompanying drawings.

BRIEF DESCRIPTION OF DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
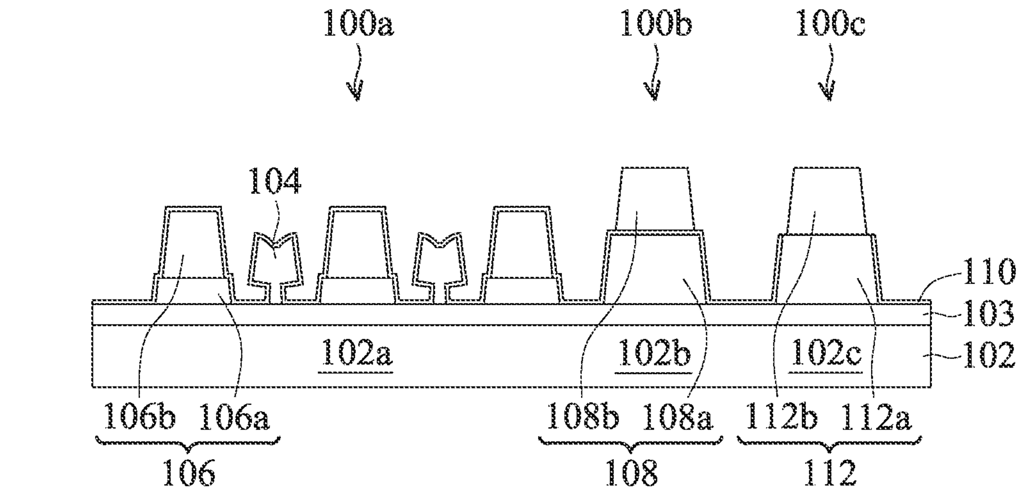
FIGS. 1A-1F are cross-sectional representations of various stages of forming a semiconductor chip in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Herein, the terms "around," "about," "substantial" usually mean within 20% of a given value or range, preferably within 10%, and better within 5%, or 3%, or 2%, or 1%, or 0.5%. It should be noted that the quantity herein is a substantial quantity, which means that the meaning of “around,” “about,” “substantial” are still implied even without specific mention of the terms “around,” “about,” “substantial.”

Although some embodiments are discussed with operations performed in a particular order, these operations may be performed in another logical order. In different embodiments, additional operations can be provided before, during, and/or after the stages described the present disclosure. Some of the stages that are described can be replaced or eliminated for different embodiments. Additional features can be added to the semiconductor structure in the present disclosure. Some of the features described below can be replaced or eliminated for different embodiments.

The present disclosure provides a semiconductor chip. The semiconductor chip may include an active device, a passive device, and a pad structure. A passivation layer is formed over the devices. A shielding structure including a barrier structure and a ceiling layer is formed surrounding the active device. A cavity may be formed between the shielding structure and the active device. The cavity may reduce the capacitance. The ceiling layer may only partially overlap the barrier structure, which may reduce wafer warpage. The passivation layer is defined by the barrier structure and the ceiling layer of the shielding structure. In addition, a backside metal stack may be formed under the substrate. The backside metal stack may include a compensating layer which may provide tensile stress to further reduce wafer warpage.

FIGS. 1A-1F are cross-sectional representations of various stages of forming a semiconductor chip 10*a* in accordance with some embodiments. FIG. 2 is a top view of a semiconductor chip 10*a* in accordance with some embodiments. In some embodiments, the semiconductor chip 10*a* includes an active device 100*a*, a passive device 100*b*, and a pad structure 100*c* formed over a substrate 102.

The active device 100*a* may include field effect transistors (FETs), such as gallium nitride high electron mobility transistors (GaN HEMT) and pseudomorphic high electron mobility transistor devices (pHEMTs). The active device 100*a* may also include a bipolar junction transistor (BJT) such as a heterojunction bipolar transistor (HBT). The passive device 100*b* may be capacitors, resistors, inductors, or other suitable passive devices. In some embodiments as shown in FIGS. 1A-1F, the active device 100*a* is a pHEMT structure and the passive device 100*b* is a capacitor. However, the devices of the embodiments of the disclosure are not limited thereto. There may be other active devices 100*a* and passive devices 100*b*, depending on the demands.

The pHEMT structure 100*a* is used in a power amplifier operating at a high frequency (e.g., at MHz frequencies, or at THz frequencies). For example, the pHEMT structures 100*a* according to embodiments of the present disclosure may be used in power amplifiers operating at D-band (in a range between 110 GHz and 170 GHz) or UHF band (in a range between 300 MHz and 3 GHz).

Figure 2:
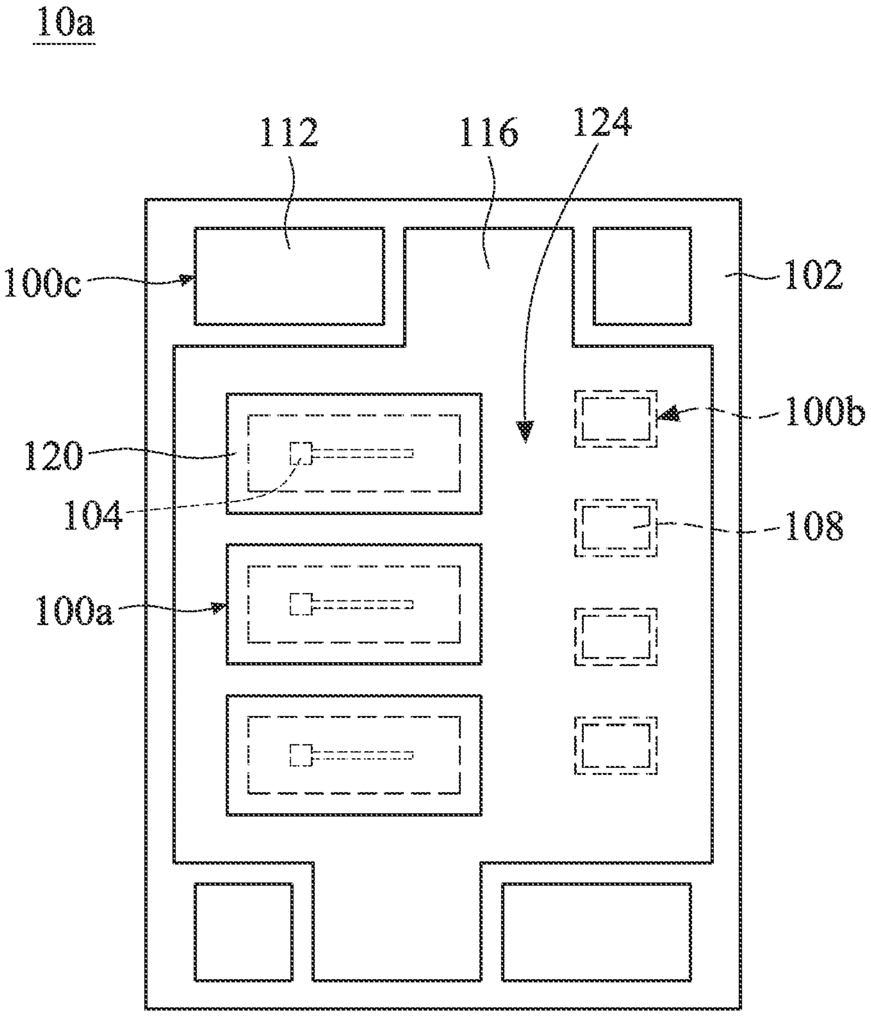
FIG. 2 is a top view of a semiconductor chip in accordance with some embodiments.

A substrate 102 is provided, as shown in FIG. 1A in accordance with some embodiments. The substrate 102 may be a semiconductor substrate. The substrate 102 may include III-V semiconductors such as GaN, AlGaN, AlN, GaAs, AlGaAs, InP, InAlAs, InGaAs, or a combination thereof. The substrate 102 may include undoped GaAs. Also, several electronic devices may be formed over the substrate 102.

In some embodiments, the substrate 102 includes a first region 102*a*, a second region 102*b*, and a third region 102*c*. In some embodiments, the active device 100*a* is formed in the first region 102*a*, the passive device 100*b* is formed in the second region 102*b*, and the pad structure 100*c* is formed in the third region 102*c*.

It should be noted that, the numbers of the active device 100*a*, the passive device 100*b*, the pad structure 100*c* shown in FIG. 1A is merely an example, the device of the embodiments of the disclosure is not limited thereto. There may be more than one active device 100*a*, one passive device 100*b*, and one pad structure 100*c* in the semiconductor chip 10*a*.

A compound semiconductor epitaxial layer 103 is formed over the substrate 102, as shown in FIG. 1A in accordance with some embodiments. The compound semiconductor epitaxial layer 103 formed over the substrate 102 serves as a base underlying the subsequently formed electrodes of the pHEMT device. The compound semiconductor epitaxial layer 103 may be a multilayer structure, and may include group III-V semiconductors such as GaN, AlGaN, AlN, GaAs, AlGaAs, InP, InAlAs, InGaAs, GaSb, or a combination thereof. The compound semiconductor epitaxial layer 103 may include one or more highly doped p-type GaAs layers which are doped by C, Mg, Zn, Ca, Be, Sr, Ba, and Ra. The doping concentration of the compound semiconductor epitaxial layer 103 may be in a range of between 1e18 $cm^{-3}$ to 1e20 $cm^{-3}$. The compound semiconductor epitaxial layer 103 may be formed by molecular-beam epitaxy (MBE), metalorganic chemical vapor deposition (MOCVD), chemical vapor deposition (CVD), hydride vapor phase epitaxy (HVPE), another suitable method, or a combination thereof.

The compound semiconductor epitaxial layer 103 of the pHEMT device may include several films epitaxially grown on the semiconductor substrate, such as a buffer layer, a channel layer, a carrier supply layer, and a Schottky barrier layer. The buffer layer may be formed over the semiconductor substrate, and the channel layer may be formed on the buffer layer. The carrier supply layer may be formed on the channel layer, and the Schottky barrier layer may be formed on the carrier supply layer. Electrodes formed subsequently may be disposed on the Schottky barrier layer.

The semiconductor substrate includes GaAs, and the buffer layer may include at least one of GaAs and AlGaAs. The channel layer may include at least one of GaAs and InGaAs, and the carrier supply layer may include at least one of AlGaAs, AlGaAsP and InAlGaAs. The Schottky barrier layer may be a single-layer structure or a multi-layer structure. The Schottky barrier layer may include AlGaAs, AlGaAsP, InAlGaAs, InGaP, InGaPAs, AlInGaP, or a combination thereof.

A gate electrode 104 is formed over the first region 102*a* of the substrate 102, as shown in FIG. 1A in accordance with some embodiments. The gate electrode 104 may include molybdenum (Mo), tungsten (W), tungsten-silicide (WSi), titanium (Ti), tungsten-titanium (TiW), iridium (Ir), palladium (Pd), platinum (Pt), nickel (Ni), cobalt (Co), chromium (Cr), ruthenium (Ru), osmium (Os), rhodium (Rh), tantalum (Ta), tantalum nitride (TaN), aluminum (Al), rhenium (Re), other applicable conductive materials, or a combination thereof. The gate electrode 104 may be formed by a physical vapor deposition (PVD) process (such as resistive heating evaporation, e-beam evaporation, or sputtering), a chemical vapor deposition (CVD) process (such as a low pressure chemical vapor deposition process or a plasma enhanced chemical vapor deposition process), electroplating, atomic layer deposition (ALD), other suitable process, or a combination thereof. In some embodiments, the gate electrode 104 is formed by an evaporation process. In some embodiments, the gate electrode 104 has a crown shape. A Schottky contact may be formed between the gate electrode 104 and the substrate 102.

Next, source/drain electrodes 106 are formed on opposite sides of the gate electrode 104 over the substrate 102, as shown in FIG. 1A in accordance with some embodiments. In some embodiments, each of the source/drain electrodes 106 includes a capping portion 106*a* and a conductive portion 106*b* formed over the capping portion 106*a*. The capping portion 106*a* of the source/drain electrodes 106 may be formed by a deposition process (e.g., molecular-beam epitaxy (MBE), metalorganic chemical vapor deposition (MOCVD), chemical vapor deposition (CVD), hydride vapor phase epitaxy (HVPE), another process, or a combination thereof) followed by a patterning process. In some embodiments, the capping portion 106*a* of the source/drain electrodes 106 includes a group III-V semiconductor such as GaN, AlGaN, AlN, GaAs, AlGaAs, InP, InAlAs, InGaAs, or a combination thereof. The capping portion 106*a* of the source/drain electrodes 106 may include highly doped n-type InGaAs, and may form ohmic contact with the subsequently formed conductive portion 106*b* of the source/drain electrodes 106.

The conductive portion 106*b* of the source/drain electrodes 106 may respectively include Ti, Al, W, Au, Pd, Au, Ge, Ni, Mo, Pt, other applicable metals, their alloys, or a combination thereof. The conductive portion 106*b* of the source/drain electrodes 106 may be formed by a deposition process followed by a patterning process. The deposition process may include electroplating, sputtering, resistive heating evaporation, physical vapor deposition (PVD), chemical vapor deposition (CVD), atomic layer deposition (ALD), another suitable process, or a combination thereof. The patterning process may include a photolithography process, an etching process, another applicable process, or a combination thereof. The conductive portion 106*b* of the source/drain electrodes 106 may also be referred as source/drain metal layers.

The semiconductor structure 10*a* also includes a dielectric layer 110 conformally formed on the active device 100*a*, as shown in FIG. 1A in accordance with some embodiments. In some embodiments, the dielectric layer 110 covers the exposed parts of the top surface of the compound semiconductor epitaxial layer 103, thereby preventing oxidation of the compound semiconductor epitaxial layer 103. In some embodiments, the dielectric layer 110 also functions as a barrier that protects the active devices 100*a* from moisture.

The dielectric layer 110 may include $Si_3N_4$, $SiO_2$, $SiO_xN_y$, one or more other suitable dielectric materials, or a combination thereof. The dielectric layer 110 may be formed by low-pressure chemical vapor deposition (LPCVD), plasma enhanced chemical vapor deposition (PECVD), atomic layer deposition (ALD), evaporation, or other suitable methods.

The dielectric layer 110 is directly and conformally formed on the gate electrodes 104 and the source/drain electrodes 106, as shown in FIG. 1A in accordance with some embodiments. For example, the dielectric layer 110 may cover the outer surfaces of the gate electrodes 104. The dielectric layer 110 may also cover the top surface and the sidewalls of the source/drain electrodes 106. Specifically, the dielectric layer 110 covers the top surface and sidewalls of the conductive portion 106*b* and sidewalls of the capping portion 106*a* of the source/drain electrodes 106.

A passive device 100*b* such as a capacitor 108 is formed in the second region 102*b* of the substrate 102, as shown in FIG. 1A in accordance with some embodiments. The capacitor 108 includes a first conductive portion 108*a* formed over the substrate 102 and a second conductive portion 108*b* formed over the first conductive portion 108*a*.

In some embodiments, the capacitor 108 also includes the dielectric layer 110 formed between the first conductive portion 108*a* and the second conductive portion 108*b*. The dielectric layer 110 may also covers the top surface and the sidewalls of the first conductive portion 108*a*, and the top surface and the sidewalls of the second conductive portion 108*b* may be exposed. The dielectric layer 110 may be formed directly over the first conductive portion 108*a*, and the second conductive portion 108*b* may be formed directly over the dielectric layer 110. It should be noted that the passive device 100*b* of the embodiments is not limited to the exemplary capacitor 108.

A pad structure 100*c* such as a conductive pad 112 is formed in the third region 102*c* of the substrate 102, as shown in FIG. 1A in accordance with some embodiments. The conductive pad 112 includes a first conductive portion 112*a* formed over the substrate 102 and a second conductive portion 112*b* formed over the first conductive portion 112*a*. In some embodiments, the second conductive portion 112*b* is in contact with the first conductive portion 112*a*.

The conductive pad 112 may also include the dielectric layer 110 formed over sidewalls of the first conductive portion 112*a*. The top surface and the sidewalls of the second conductive portion 112*b* may be exposed.

The conductive portion 106*b* of the source/drain electrodes 106 of the active device 100*a*, the first conductive portion 108*a* of the passive device 100*b*, and the first conductive portion 112*a* of the pad structure 100*c* may be formed by patterning the same conductive material layer.

The dielectric layer 110 may be conformally formed over the capping portion 106*a* and a conductive portion 106*b* of the source/drain electrodes 106, the gate electrode 104, the first conductive portion 108*a* of the passive device 100*b*, and the first conductive portion 112*a* of the pad structure 100*c*. Afterwards, an opening of the dielectric layer 110 may be formed over the first conductive portion 112*a* of the pad structure 100*c*, and the second conductive portion 108*b* of the passive device 100*b* and the second conductive portion 112*b* of the pad structure 100*c* may be formed over the first conductive portion 108*a* of the passive device 100*b* and the first conductive portion 112*a* of the pad structure 100*c* respectively. The opening of the dielectric layer 110 may be formed by a patterning process. The patterning process may include a photolithography process and etching process. Examples of photolithography processes include photoresist coating, soft baking, mask aligning, exposure, post-exposure baking, developing the photoresist, rinsing and drying. The etching process may be a dry etching process or a wet etching process.

Figure 1B:
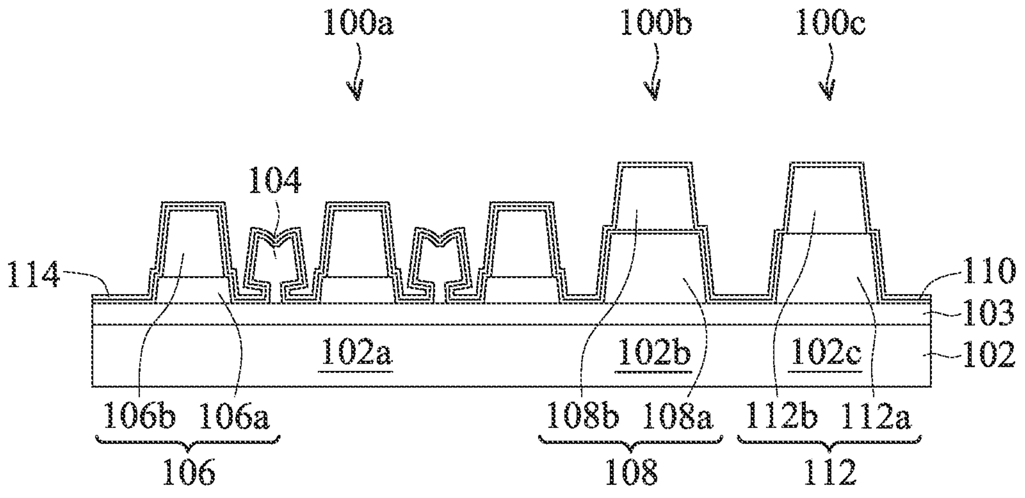

Next, a passivation layer 114 is formed over the substrate 102, as shown in FIG. 1B in accordance with some embodiments. The passivation layer 114 may be formed over the entire substrate 102 as a passivation blanket film that covers the devices in the first region 100*a*, and the second region 100*b*, and the third region 100*c*. In some embodiments, the passivation layer 114 is formed over the dielectric layer 110 and the second conductive portions 108*b* and 112*b*. The passivation layer 114 may cover the active device 100*a*, the passive device 100*b*, the pad structure 100*c*, and the compound semiconductor epitaxial layer 103. The passivation layer 114 may provide an effective environmental barrier that protects the devices from moisture.

The passivation layer 114 may include $Al_2O_3$, $Si_3N_4$, $SiO_2$, $SiO_xN_y$, AlN, $HfO_2$, one or more other suitable passivation materials, or a combination thereof. In some embodiments, the passivation layer 114 includes $Al_2O_3$. The passivation layer 114 may be formed by atomic layer deposition (ALD), physical vapor deposition (PVD), chemical vapor deposition (CVD), or other suitable methods. In some embodiments, the passivation layer 114 is deposited by atomic layer deposition.

In some embodiments, the passivation layer 114 has a thickness in the range of about 100 Å to about 750 Å. If the passivation layer 114 is too thick, the parasitic capacitance may be too great. If the passivation layer 114 is too thin, it may not protect the devices from moisture.

Figure 1C:
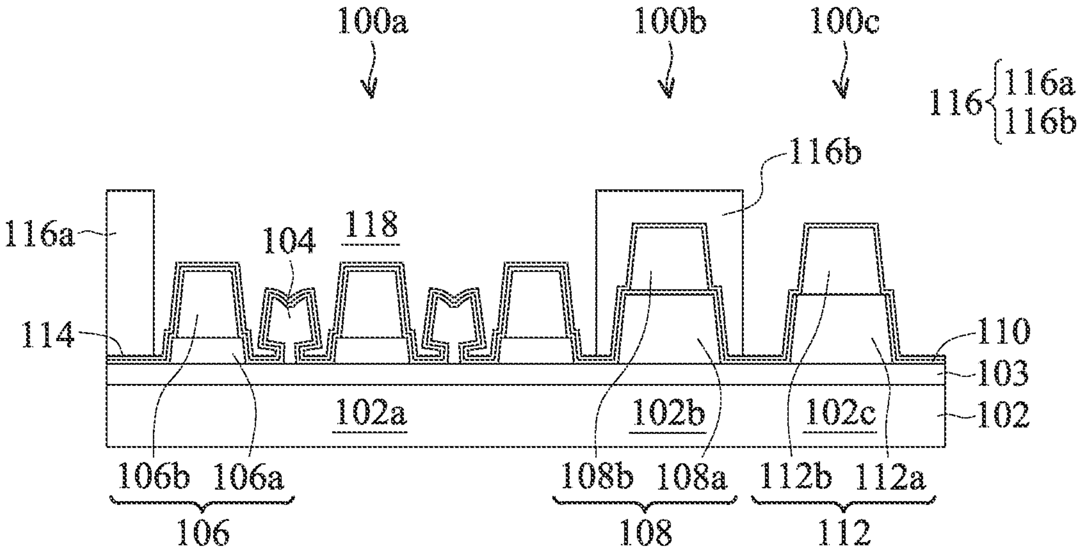
Figure 1D:
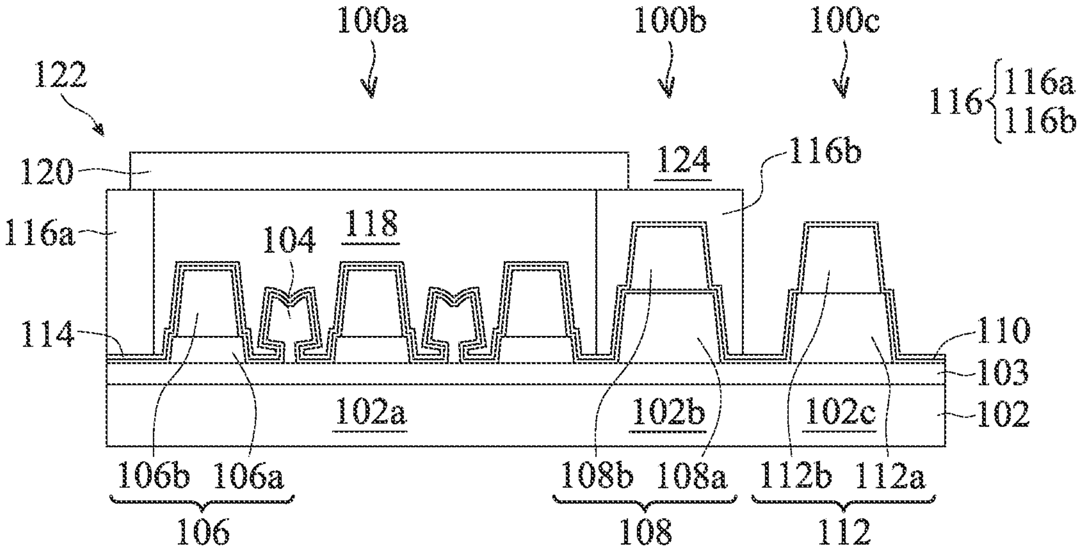

Next, a barrier structure 116 is formed surrounding the active device 100*a* and over the passive device 100*b*, as shown in FIG. 1C in accordance with some embodiments. The barrier structure 116 may be formed by providing a barrier material layer on the passivation layer 114, followed by patterning the barrier material layer. After the barrier material layer is patterned, the remaining portions of the barrier material layer are referred to as the first barrier portion 116*a* in the first region 102*a* and the second barrier portion 116*b* in the second region 102*b*. The barrier structure 116 may surround the gate electrodes 104 and the source/drain electrode 106 in the top view. The barrier structure 116 defines an opening 118 that exposes the portion of the passivation layer 114 that covers the gate electrodes 104 and the source/drain electrodes 106. In addition, the pad structure 112 is also exposed from the barrier structure 116. As shown in FIG. 1D, the barrier structure 116 is formed directly on the passivation layer 114, in accordance with some embodiments.

In some embodiments, the barrier structure 116 and the passivation layer 114 include different materials. The material of the barrier structure 116 may have lower moisture permeability than that of the material of the passivation layer 114. For example, the barrier structure 116 may be made of a material having a first water vapor transmission rate (WVTR), the passivation layer 114 may be made of another material having a second water vapor transmission rate, and the first water vapor transmission rate is less than the second water vapor transmission rate.

The barrier structure 116 may include one or more organic materials, such as a polymer material. The barrier structure 116 may include a photoresist material. Material examples of the barrier structure 116 include polydimethylsiloxane (PDMS), SU8 (i.e. an epoxy material from MicroChem Inc.®), CYTOP® (from Asahi Glass Company), DuPont® WPR® (wafer photoresist), and another appropriate material. Also, a barrier material layer may be formed over the substrate 102 by spin coating, spray coating, thermal vapor deposition (TVD) or any other suitable method, followed by patterning the barrier material layer to form the barrier structure 116. In some embodiments, the barrier structure 116 is formed using a dry film process.

The barrier material layer may be made of, but not limited to, the epoxy based, photo sensitive polymer SU8, and then SU8 is patterned by a lithography process to form the barrier structure 116. SU8 is a photoresist that has good mechanical durability, water impermeability and dielectric properties on polymerization, and can easily be patterned to obtain the portions with high aspect ratios. Thus, in some embodiments, SU8 can be used as the material to form the first barrier portion 116*a* of the barrier structure 116 with a high aspect ratio, thereby creating an opening 118 having a sufficient height.

In some embodiments, the barrier structure 116 has a thickness in the range of about 100000 Å to about 500000 Å. If the barrier structure 116 is too thick, substrate will be bent severely owing to residual stress. If the barrier structure 116 is too thin, the parasitic effect may degrade device performance.

Next, a ceiling layer 120 is formed on the barrier structure 116, thereby forming a shielding structure 122. The shielding structure 122 may include the barrier structure 116 and the ceiling layer 120 formed over the barrier structure 116. In some embodiments, the ceiling layer 120 is in direct contact with the barrier structure 116. The materials and processes for forming the ceiling layer 120 may be the same as, or similar to, those used for forming the barrier structure 116. For the purpose of brevity, the descriptions of the materials and processes of the ceiling layer 120 are not repeated herein.

In some embodiments, the ceiling layer 120 has a thickness in the range of about 100000 Å to about 500000 Å. If the ceiling layer 120 is too thick, substrate will be bent severely owing to residual stress. If the ceiling layer 120 is too thin, ceiling layer may be collapsed since weak mechanical strength.

In some embodiments, an air cavity 118 is formed over the active device 100*a* between the barrier structure 116 and the ceiling layer 120. In some embodiments, the ceiling layer 120 is suspended on the barrier structure 116, and configured as a roof of the shielding structure 122.

Position of the barrier structure 116 of the shielding structure 122 can be determined according to the design conditions of the application, such as the dimensions of the source/drain electrodes 106 and the gate electrodes 104, and the distances between the source/drain electrodes 106 and the gate electrodes 104.

In some embodiments as shown in FIG. 1D, the ceiling layer 120 of the shielding structure 122 only partially covers the barrier structure 116 of the shielding structure 122, and an opening 124 of the ceiling layer 120 is formed over the passive device 100*b*. In some embodiments, the ceiling layer 120 has the opening 124 exposing the barrier structure 116 on the passive device 100*b*. In some embodiments, the top surface of the barrier structure 116 covering the passive device 100*b* is partially exposed. In addition, the pad structure 100*c* may be exposed from the ceiling layer 120 and the barrier structure 116 of the shieling structure 122. With the opening 124 formed in the ceiling layer 120 exposing the barrier structure 116 over the passive device 100*b*, the wafer warpage may be reduced.

Figure 1E:
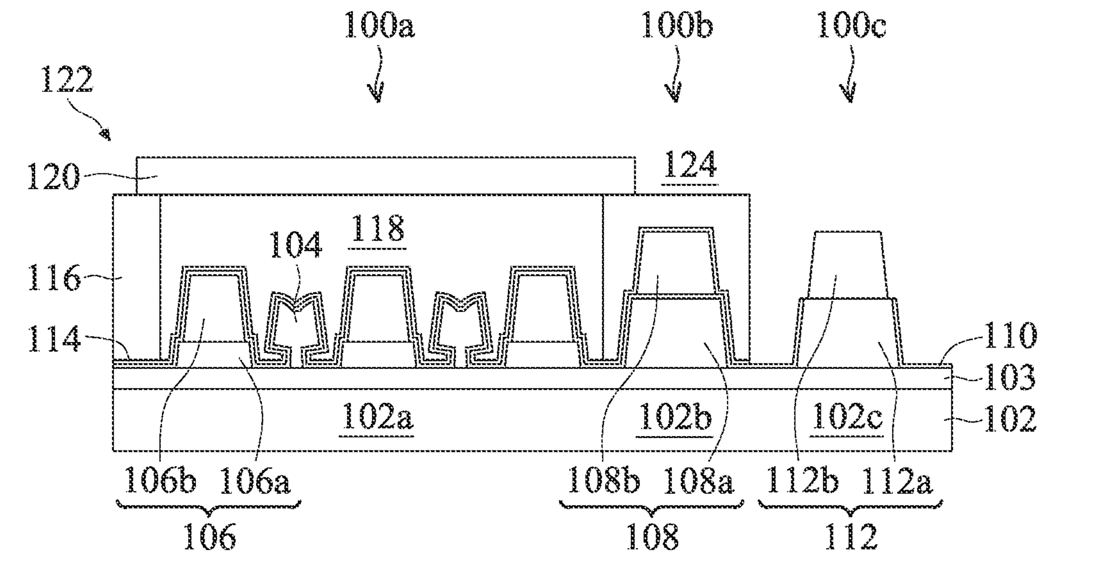

Next, the passivation layer 114 exposed from the shielding structure 122 is removed by using the ceiling layer 120 and the barrier structure 116 as a mask layer, as shown in FIG. 1E in accordance with some embodiments. The pattern of the passivation layer 114 may be defined by the pattern of the barrier structure 116 and the pattern of the ceiling layer 120. The passivation layer 114 may be removed by an etching process such as a dry etching process or a wet etching process. In some embodiments, the projection of the passivation layer 114 on the substrate 102 may overlap the projection of the barrier structure 116 and the ceiling layer 120 on the substrate 102 from a top view. In some embodiments, the passivation layer 114 is covered by the barrier structure 116 and the ceiling layer 120, and the passivation layer 114 is vertically separated from the ceiling layer 120.

Next, the semiconductor device 10*a* may be flipped over, and a via hole 126 is formed through the substrate 102 and the compound semiconductor epitaxial layer 103. In some embodiments, the via hole 126 is extended into the capping portion 106*a* of the source/drain electrode 106. The via hole 126 may be formed by a patterning process including a photolithography process and etching process.

Figure 1F:
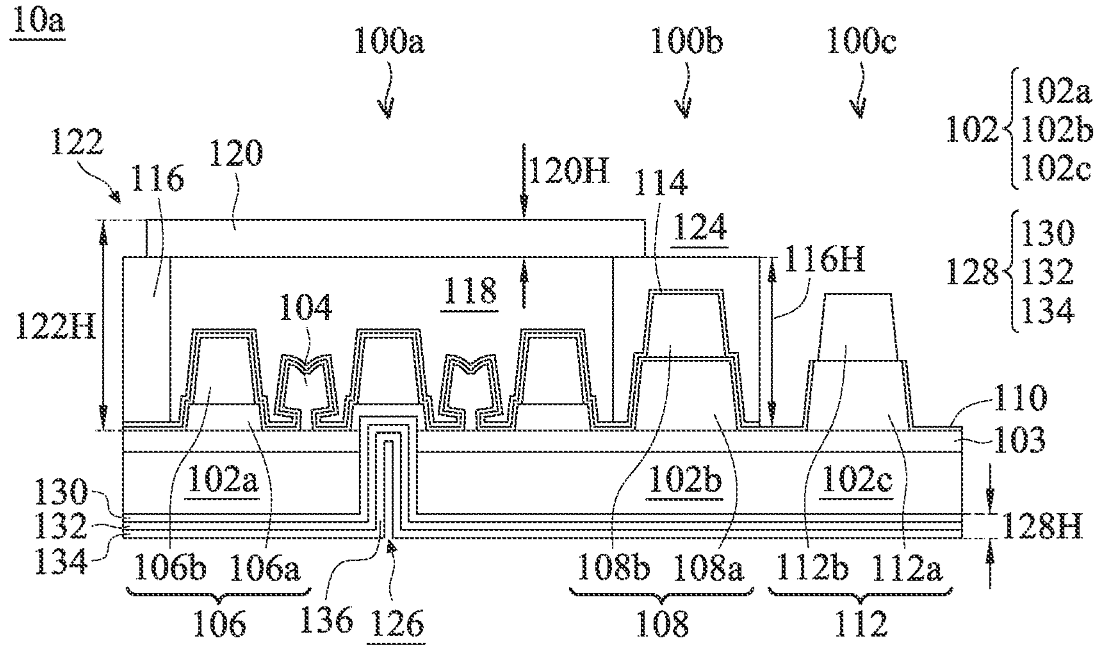

Afterwards, a metal stack 128 including a compensating layer 132 sandwiched between a contact layer 130 and a conductive layer 134 is formed under the substrate 102. In some embodiments, the compensating layer 132, the contact layer 130, and the conductive layer 134 are conformally formed under the substrate 102 and a via structure 136 is formed in the via hole 126. The metal stack 128 is conformally formed in the via hole 126 as the via structure 136. In some embodiments as shown in FIG. 1F, the metal stack 128 is formed protruding in the substrate 102, the compound semiconductor epitaxial layer 103, and the source/drain electrode 106. The via structure 136 may be formed by the metal stack 128 formed in the via hole 126. In some embodiments, the via structure 136 is in contact with the capping portion 106*a* of the source/drain electrode 106. In some embodiments, the metal layer stack 128 is in direct contact with the active device 100*a*.

The contact layer 130 may include metal such as Pd, Ge, Ni, Ti, Pt, Au, Ag, other suitable material, or a combination thereof. The compensating layer 132 may include TiW, Ti, W, Au, TiWN, WN, an alloy thereof, or a combination thereof. The conductive layer 134 may include metal such as Au, Ag, Sn, an alloy thereof, silver conductive epoxy adhesive, or a combination thereof. In some embodiments, the metal stack 128 includes a compensating layer 132 made of TiW sandwiched between a contact layer 130 made of Pd and a conductive layer 134 made of Au. With the compensating layer 132 formed between the contact layer 130 and the conductive layer 134, the stress produced by the shielding structure 122 may be compensated for by the stress of the compensating layer 132. Therefore, wafer warpage may be prevented.

In some embodiments as shown in FIG. 1F, the ceiling layer 120 has a thickness 120H. The barrier structure 116 has a thickness 116H, the metal stack 128 has a thickness 128H, and the shielding structure 122 has a thickness 122H. The thickness 122H of the shielding structure 122 is the sum of the thickness 116H of the barrier structure 116 and the thickness 120H of the ceiling layer 120.

In some embodiments, the ratio of the thickness 128H of the metal stack 128 to the thickness 116H of the barrier structure 116 is in a range of about 2 to about 20. In some embodiments, the ratio of the thickness 128H of the metal stack 128 to the thickness 120H of the ceiling layer 120 is in a range of about 2 to about 20. In some embodiments, the ratio of the thickness 128H of the metal stack 128 to the total thickness 122H of the shielding structure 122 in a range of about 4 to about 40. If the metal stack 128 is too thick, the wafer warpage may be worse. If the metal stack 128 is too thin, there may be not enough stress to compensate the stress produced by the shielding structure 122.

FIG. 2 is a top view of a semiconductor chip 10*a* in accordance with some embodiments. In some embodiments as shown in FIG. 2, the ceiling layer 120 only covers the active devices 100*a*, and the barrier structure 116 formed over the passive devices 100*b* is exposed from the ceiling layer 120, which may reduce wafer warpage.

In some embodiments, the ratio of the area of the ceiling layer 120 to the area of the semiconductor chip 10*a* is in a range of about 2 to about 50. In some embodiments, the ratio of the area of the ceiling layer 120 to the area of the barrier structure 116 is in a range of about 2 to about 20. If the area of the ceiling layer 120 is too great, the wafer warpage issue may be worse. If the area of the ceiling layer 120 is too less, it may not protect the active devices 100*a* from moisture.

With the ceiling layer 120 of the shielding structure 122 has an opening 124 exposing the barrier structure 116 of the shielding structure 122 formed over the passive devices 100*b*, the wafer warpage may be reduced. The passivation layer 114 may be defined by using the ceiling layer 120 and the barrier structure 116 as a mask layer. In addition, with a compensating layer 132 located in the metal stack 128, the stress produced by the shielding structure 122 may be compensated for, and the issue of wafer warpage may be further improved.

Many variations and/or modifications may be made to the embodiments of the disclosure. FIGS. 3A-3D are cross-sectional representations of various stages of forming a semiconductor chip 10*b* in accordance with some embodiments. Some processes or devices are the same as, or similar to, those described in the embodiments above, and therefore the descriptions of these processes and devices are not repeated herein. The difference from the embodiments described above is that, as shown in FIG. 3A in accordance with some other embodiments, the barrier structure 116 of the shielding structure 122 includes a first barrier portion 116*a* and a third barrier portion 116*c* surrounding the active device 100*a*, and a second barrier portion 116*b* covering the passive device 108.

In some embodiments, the second barrier portion 116*b* and the third barrier portion 116*c* of the barrier structure 116 are separated from each other. An opening 138 is formed between the second barrier portion 116*b* and the third barrier portion 116*c* of the barrier structure 116. In some embodiments, the passivation layer 114 is exposed in the opening 138.

Figure 3A:
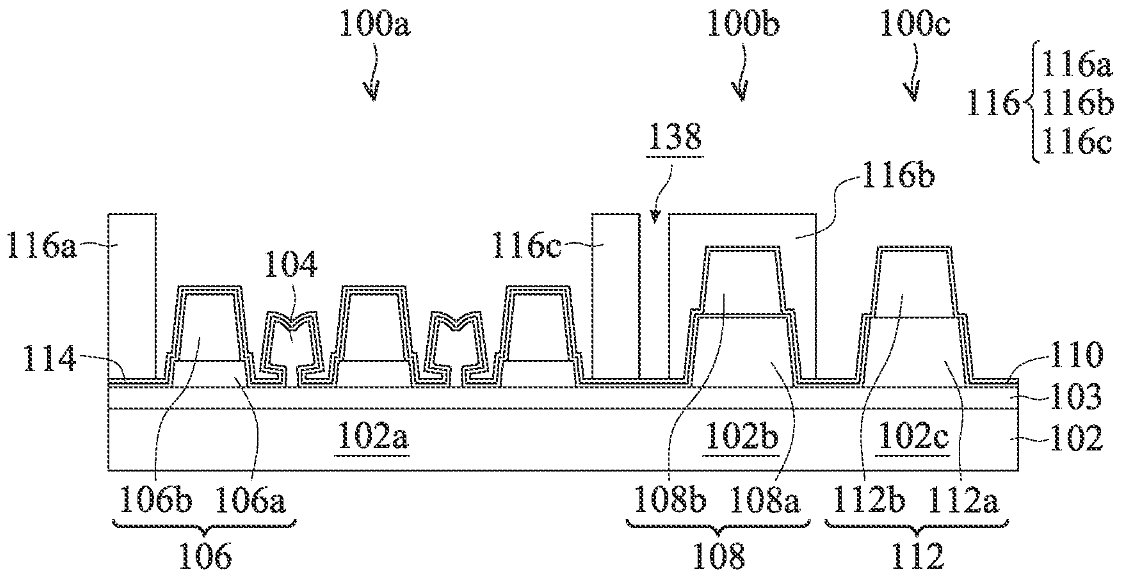
FIGS. 3A-3D are cross-sectional representations of various stages of forming a semiconductor chip in accordance with some embodiments.
Figure 3B:
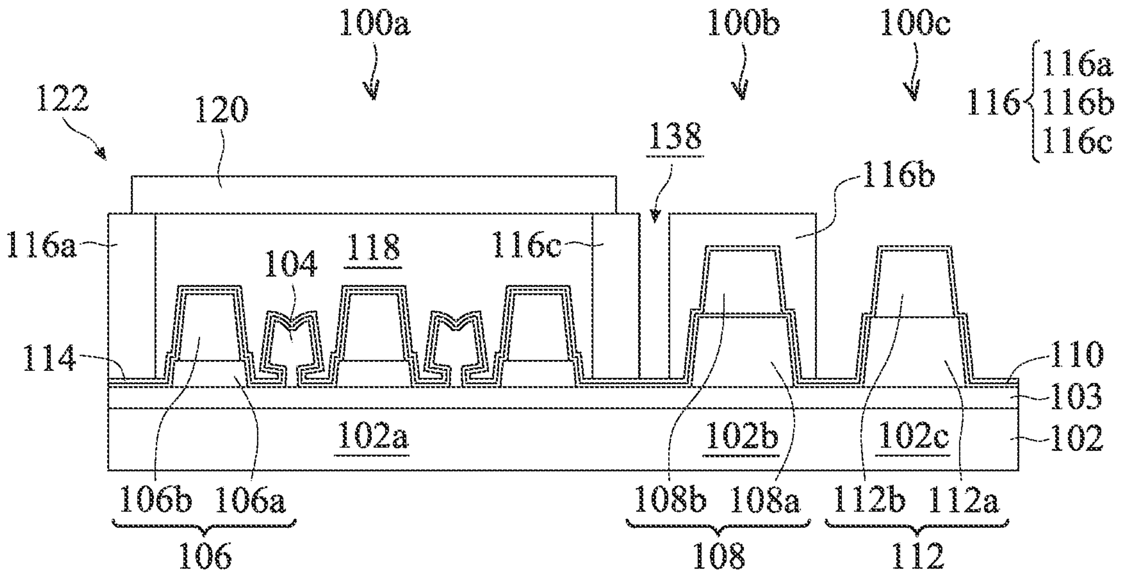

Next, the ceiling layer 120 is formed over the first barrier portion 116*a* and the third barrier portion 116*c* of the barrier structure 116, as shown in FIG. 3B in accordance with some other embodiments. In some embodiments, the ceiling layer 120 only partially covers the first barrier portion 116*a* and the third barrier portion 116*c* of the barrier structure 116. In some embodiments, the second barrier portion 116*b* is completely exposed from the ceiling layer 120. Since the area of the barrier structure 116 covered by the ceiling layer 120 is reduced, the wafer warpage may be reduced.

Figure 3C:
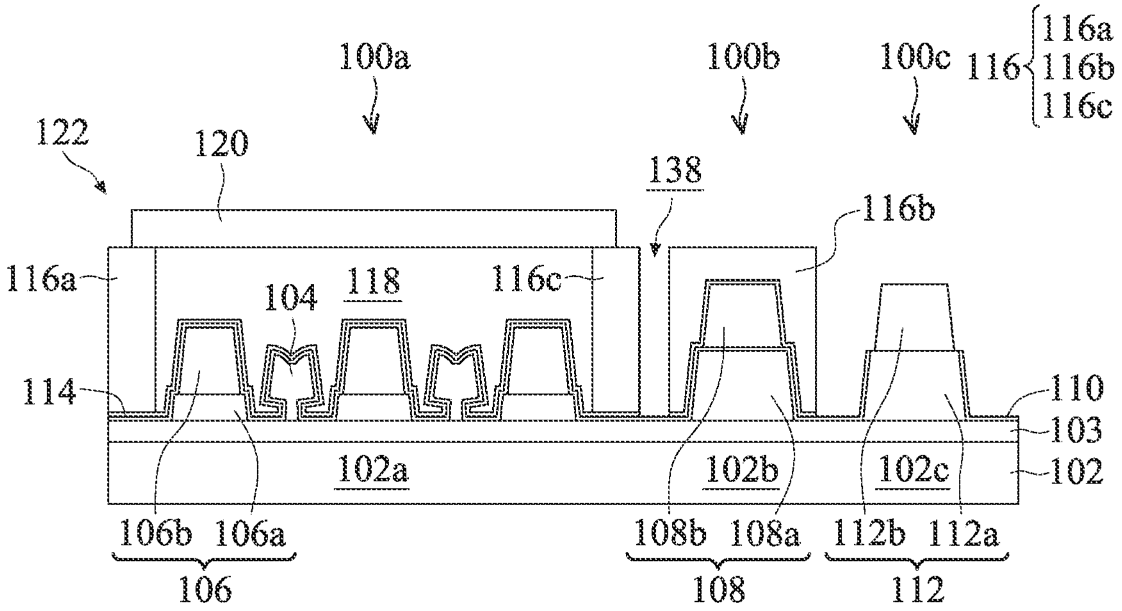

Afterwards, the passivation layer 114 exposed from the shielding structure 122 is removed by using the ceiling layer 120 and the barrier structure 116 as a mask layer, as shown in FIG. 3C in accordance with some embodiments. In some embodiments, the dielectric layer 110 formed between the third barrier portion 116*c* and the second barrier portion 116*b* is exposed after the passivation layer 114 is removed.

Figure 3D:
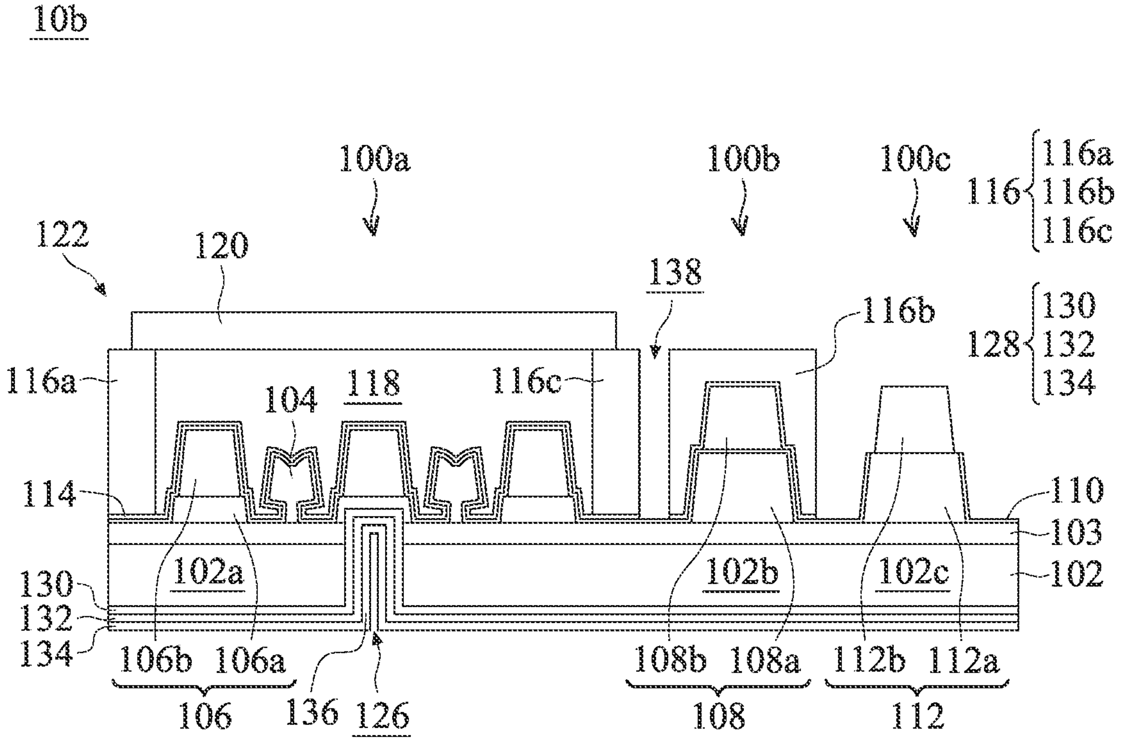

Afterwards, a metal stack 128 including a compensating layer 132 sandwiched between a contact layer 130 and a conductive layer 134 is formed under the substrate 102, as shown in FIG. 3D in accordance with some embodiments. The via structure 136 is formed in the substrate 102 connecting the source/drain electrodes 104. Processes and materials used to form the metal stack 128 and the via structure 136 may be similar to, or the same as, those used to form the metal stack 128 and the via structure 136 described in the previous embodiments, and are not repeated herein for brevity.

Figure 4:
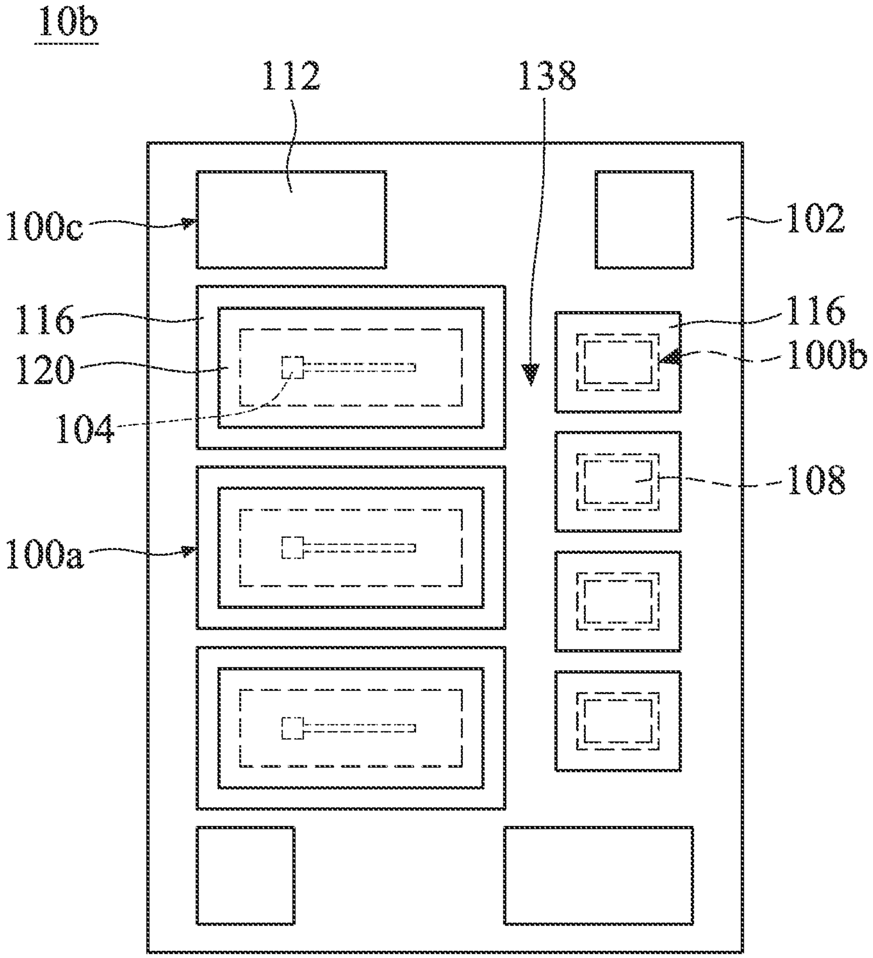
FIG. 4 is a top view of a semiconductor chip in accordance with some embodiments.

FIG. 4 is a top view of a semiconductor chip 10*b* in accordance with some embodiments. In some embodiments as shown in FIG. 4, the barrier structures 116 surrounding the active device 100*a* and the barrier structures 116 covering the passive device 100*b* are separated from each other. The ceiling layer 120 only covers the active devices 100*a* and a portion of the barrier structures 116 surrounding the active device 100*a*. The barrier structure 116 formed over the passive devices 100*b* is exposed. With less volume of the shielding structure 122 including the ceiling layer 120 and the barrier structure 116, the wafer warpage issue may be further improved.

With the ceiling layer 120 of the shielding structure 122 exposing the barrier structure 116 of the shielding structure 122 over the passive devices 100*b*, the wafer warpage may be reduced. The passivation layer 114 may be defined by using the ceiling layer 120 and the barrier structure as a mask layer. In addition, with a compensating layer 132 located in the metal stack 128, the stress produced by the shielding structure 122 may be compensated for, and the warpage issue may be further improved. The barrier structure 116 with an opening 138 formed between the active device 100*a* and the passive device 110*b* may further reduce wafer warpage.

Many variations and/or modifications may be made to the embodiments of the disclosure. FIGS. 5A-5D are cross-sectional representations of various stages of forming a semiconductor chip 10*c* in accordance with some embodiments. Some processes or devices are the same as, or similar to, those described in the embodiments above, and therefore the descriptions of these processes and devices are not repeated herein. The difference from the embodiments described above is that, as shown in FIG. 5A in accordance with some other embodiments, the passive device 100*b* is exposed and not covered by the barrier structure 116.

Figure 5A:
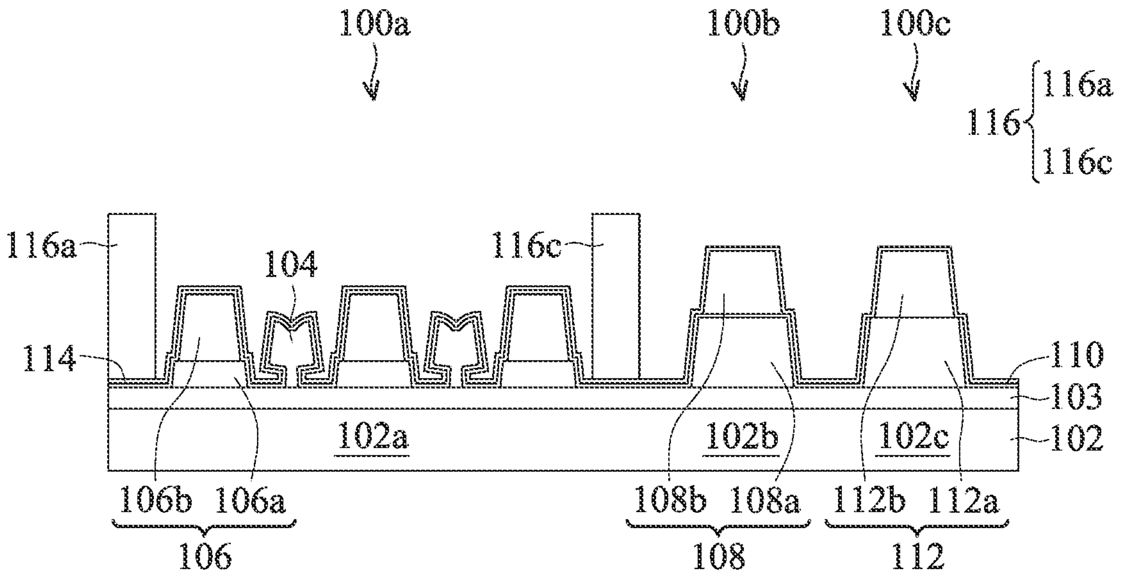
FIGS. 5A-5D are cross-sectional representations of various stages of forming a semiconductor chip in accordance with some embodiments.

In some embodiments as shown in FIG. 5A, the barrier structure 116 includes a first barrier portion 116*a* and a third barrier portion 116*c* surrounding the active device 100*a* and exposing the passive device 100*b*. In some embodiments, the barrier structure 116 is separated from the passive device 100*b*.

Figure 5B:
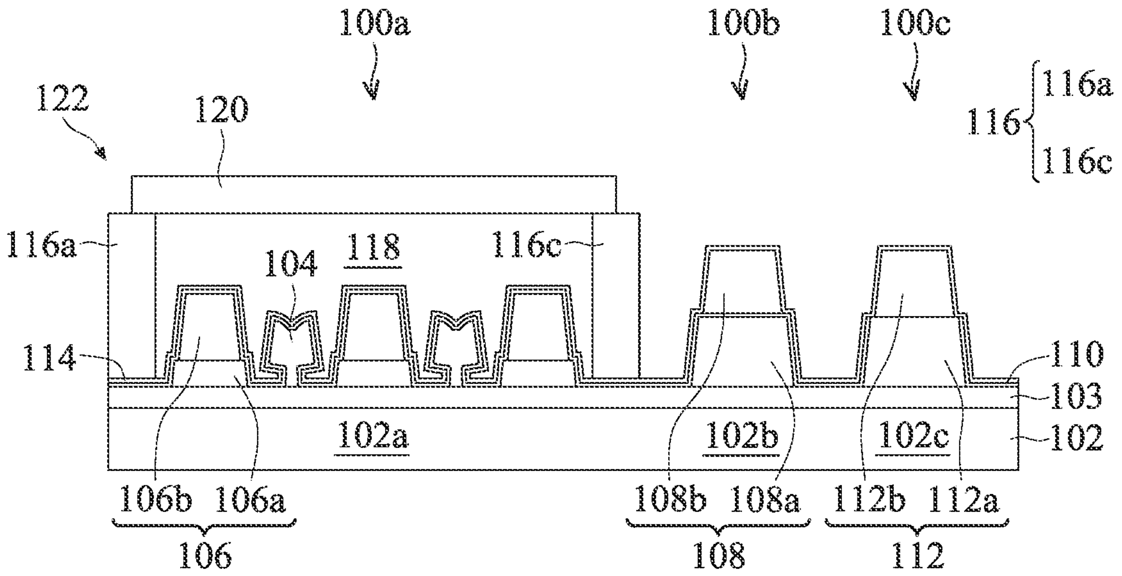

Next, the ceiling layer 120 is formed over the first barrier portion 116*a* and the third barrier portion 116*c* of the barrier structure 116, as shown in FIG. 5B in accordance with some other embodiments. In some embodiments, the ceiling layer 120 only partially covers the first barrier portion 116*a* and the third barrier portion 116*c* of the barrier structure 116. Without the barrier structure 116 formed over the passive device 100*b*, the volume of the shielding structure 122 may be reduced, and the wafer warpage may be reduced.

Figure 5C:
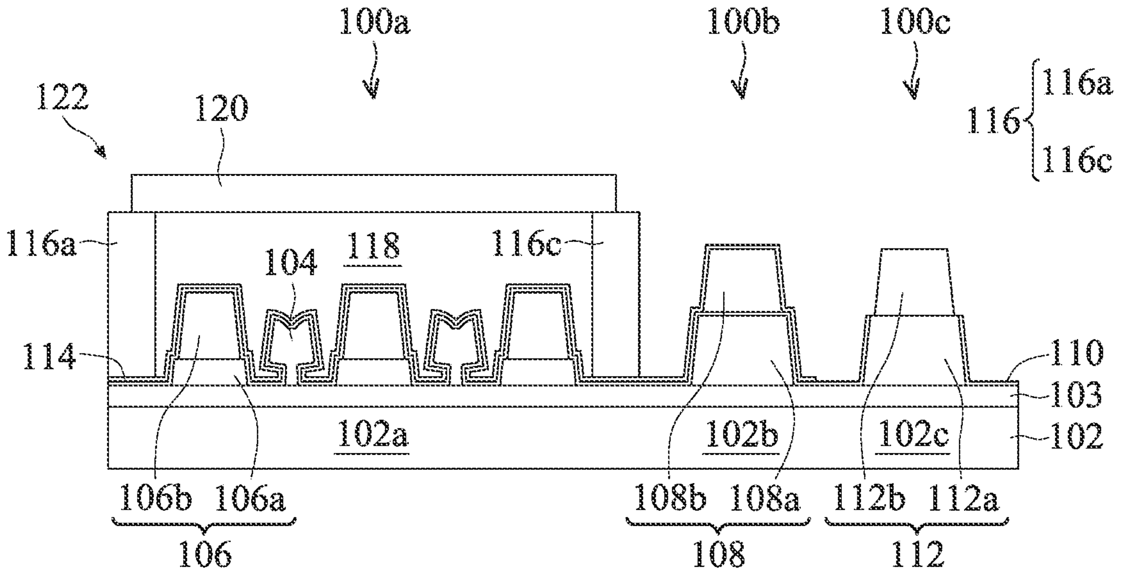

Afterwards, the passivation layer 114 formed over the pad structure 100*c* is removed by a patterning process, as shown in FIG. 5C in accordance with some embodiments. The patterning process may include a photolithography process and etching process. The photolithography process may be performed by a mask layer. After the patterning process, the dielectric layer 110 and the second conductive portion 112*b* of the conductive pad 112 in the third region 102*c* may be exposed. The passivation layer 114 covering the passive device 100*b* in the second region 102*b* may also be exposed.

Figure 5D:
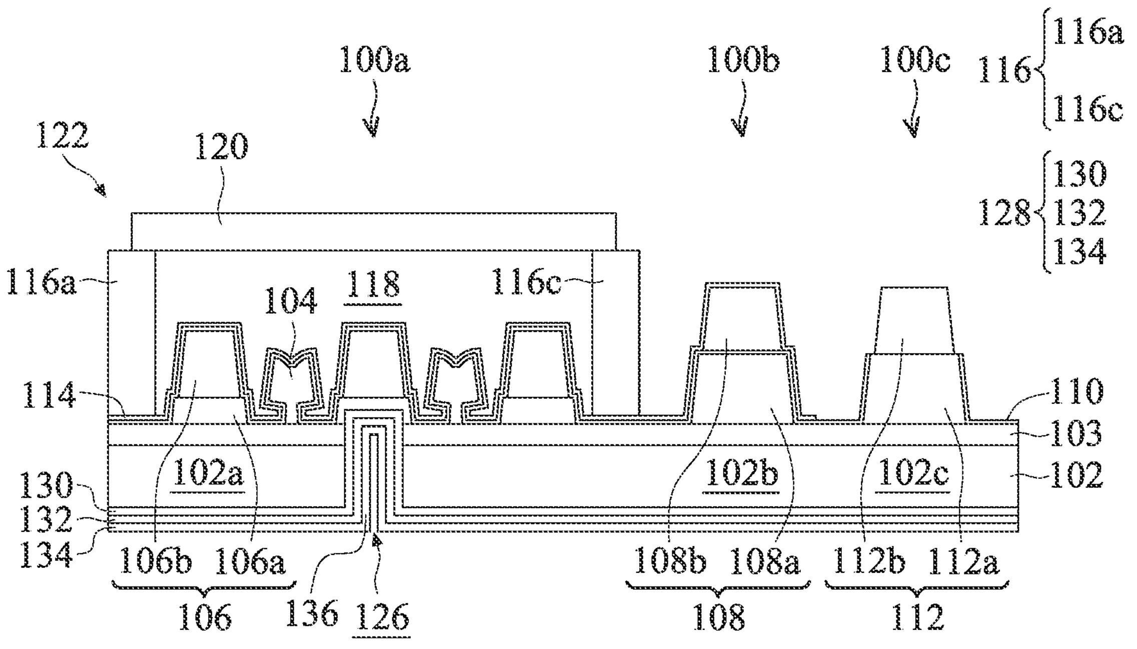

Afterwards, a metal stack 128 including a compensating layer 132 sandwiched between a contact layer 130 and a conductive layer 134 is formed under the substrate 102, as shown in FIG. 5D in accordance with some embodiments. The via structure 136 is formed in the substrate 102 connecting the source/drain electrodes 104. Processes and materials used to form the metal stack 128 and the via structure 136 may be similar to, or the same as, those used to form the metal stack 128 and the via structure 136 described in the previous embodiments, and are not repeated herein for brevity.

Figure 6:
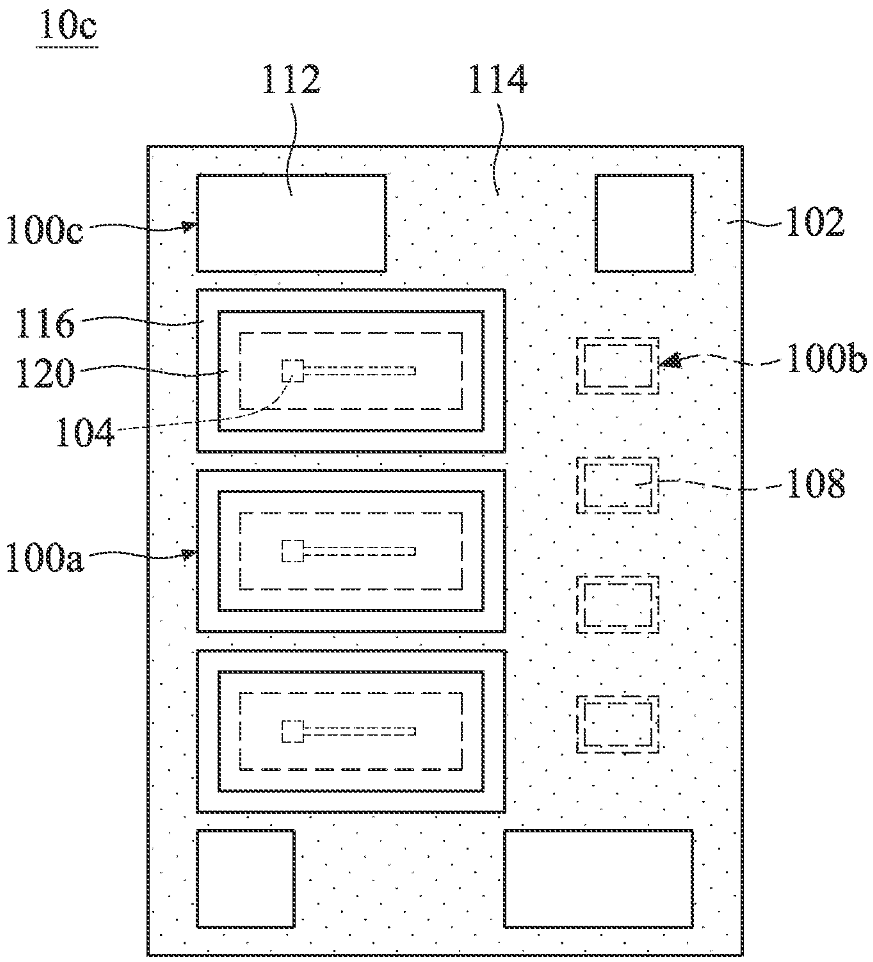
FIG. 6 is a top view of a semiconductor chip in accordance with some embodiments.

FIG. 6 is a top view of a semiconductor chip 10*c* in accordance with some embodiments. In some embodiments as shown in FIG. 6, the barrier structures 116 only surrounds the active device 100*a* and does not cover the passive device 100*b*. The ceiling layer 120 only covers the active devices 100*a* and a portion of the barrier structures 116 surrounding the active device 100*a*. With less volume of the shielding structure 122 including the ceiling layer 120 and the barrier structure 116, the wafer warpage may be further reduced.

With the ceiling layer 120 of the shielding structure 122 exposing the passive devices 100*b*, the wafer warpage may be reduced. The passivation layer 114 may be defined by a mask layer. In addition, with a compensating layer 132 located in the metal stack 128, the stress produced by the shielding structure 122 may be compensated for, and the wafer warpage may be reduced. With the barrier structure 116 only formed surrounding the active device 100*a* and exposing the passive device 100*b* and the pad structure 100*c*, the volume of the shielding structure 122 is further reduced, and the wafer warpage may be reduced.

Many variations and/or modifications may be made to the embodiments of the disclosure. FIGS. 7A-7D are cross-sectional representations of various stages of forming a semiconductor chip 10*d* in accordance with some embodiments. Some processes or devices are the same as, or similar to, those described in the embodiments above, and therefore the descriptions of these processes and devices are not repeated herein. The difference from the embodiments described above is that, as shown in FIG. 7A in accordance with some other embodiments, the barrier structure 116 further covers a portion of the pad structure 100*c*.

Figure 7A:
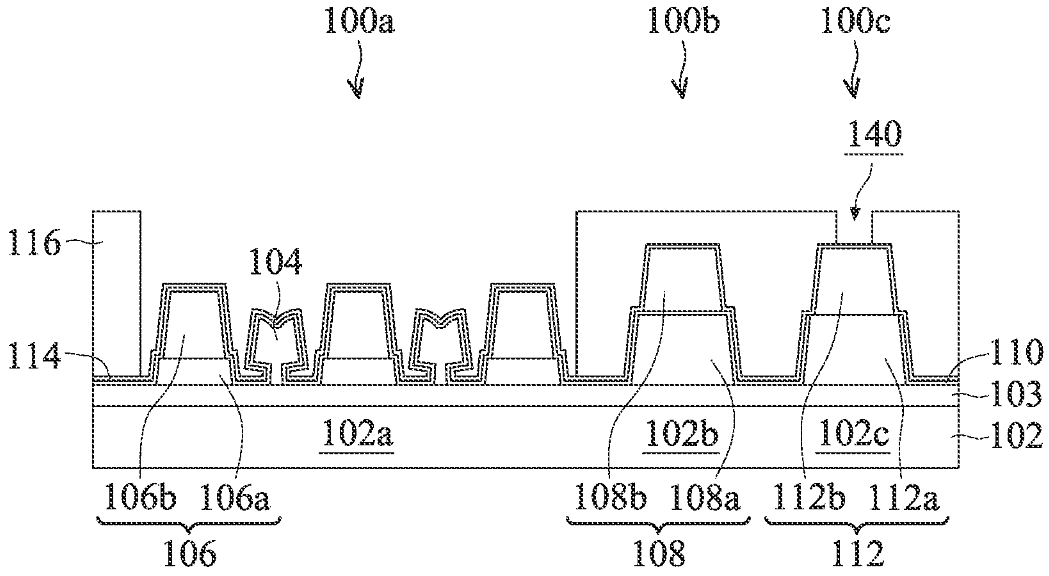
FIGS. 7A-7D are cross-sectional representations of various stages of forming a semiconductor chip in accordance with some embodiments.

In some embodiments as shown in FIG. 7A, the barrier structure 116 is formed over the passive device 100*b* and the pad structure 100*c*. The pad structure 100*c* may be partially covered by the barrier structure 116. An opening 140 is formed in the barrier structure 116 exposing the pad structure 100*c*. In some embodiments, the passivation layer 114 covering the pad structure 100*c* is exposed in the opening 140. The barrier structure 116 covering the pad structure 100*c* may protect the pad structure 100*c* from moisture. In some embodiments, the barrier structure 116 has a thickness 116H, and the passive device 100*b* such as the capacitor 108 has a height 108H. In some embodiments, the thickness 116H of the barrier structure 116 is greater than the height 108H of the passive device 100*b* such as the capacitor 108.

Figure 7B:
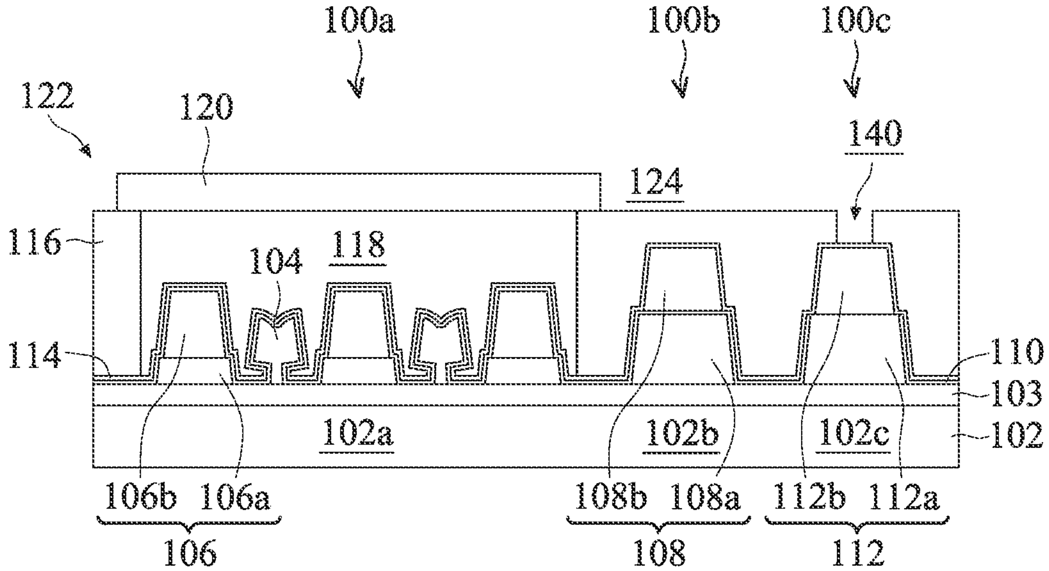

Next, the ceiling layer 120 is formed over the barrier structure 116, as shown in FIG. 7B accordance with some other embodiments. In some embodiments, an opening 124 is formed in the ceiling layer 120 and the passive device 100*b* and the pad structure 100*c* is not covered by the ceiling layer 120. The barrier structure 116 covering the passive device 100*b* and the pad structure 100*c* is exposed. Compared to the case which the barrier structure 116 is completely covered by the ceiling layer 120, the area of the barrier structure 116 covered by the ceiling layer 120 is reduced, the wafer warpage may be reduced.

Figure 7C:
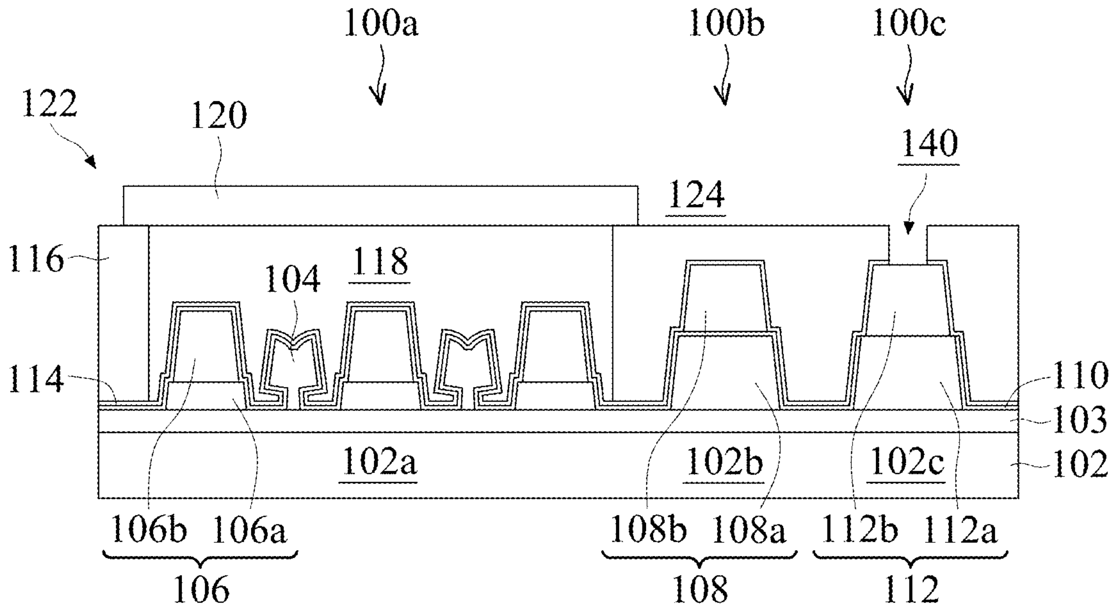

Afterwards, the passivation layer 114 exposed from the shielding structure 122 is removed by using the ceiling layer 120 and the barrier structure 116 as a mask layer, as shown in FIG. 7C in accordance with some embodiments. In some embodiments, the second conductive portion 112*b* of the conductive pad 112 is exposed from the opening 140 after the passivation layer 114 is removed.

Figure 7D:
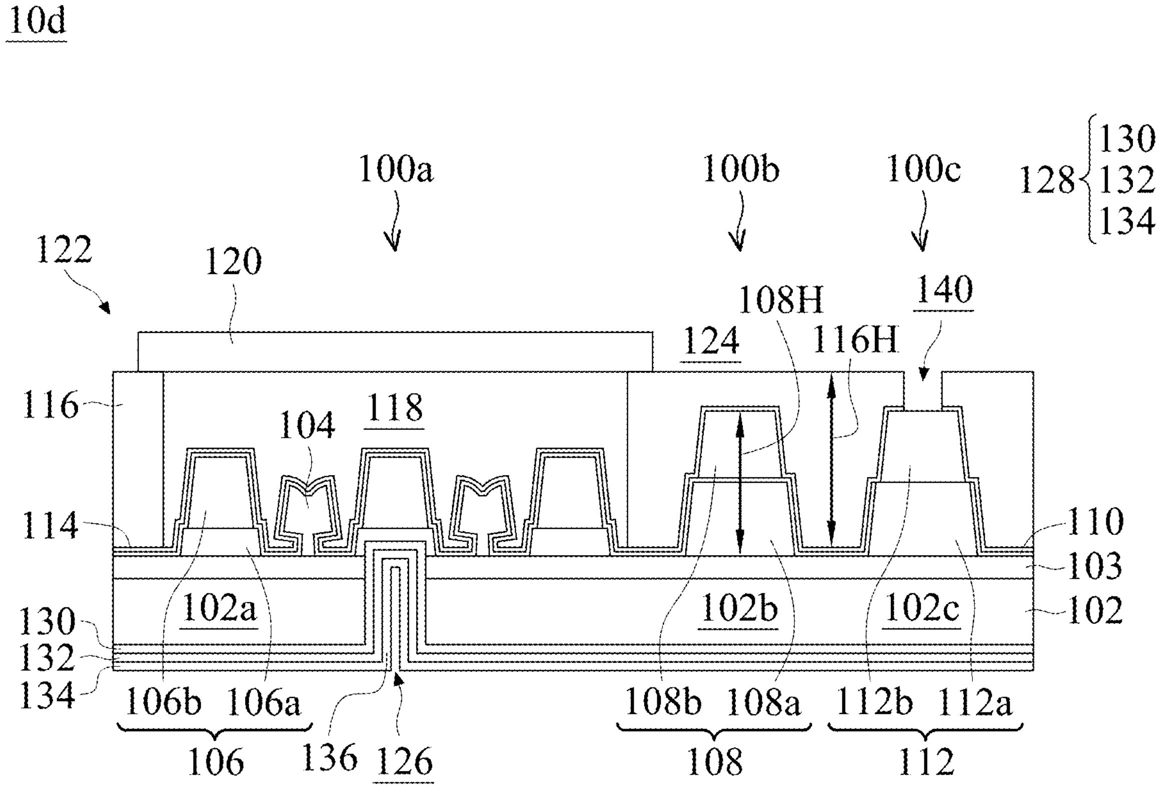

Afterwards, a metal stack 128 including a compensating layer 132 sandwiched between a contact layer 130 and a conductive layer 134 is formed under the substrate 102, as shown in FIG. 7D in accordance with some embodiments. The via structure 136 is formed in the substrate 102 connecting the source/drain electrodes 104. Processes and materials used to form the metal stack 128 and the via structure 136 may be similar to, or the same as, those used to form the metal stack 128 and the via structure 136 described in the previous embodiments, and are not repeated herein for brevity.

Figure 8:
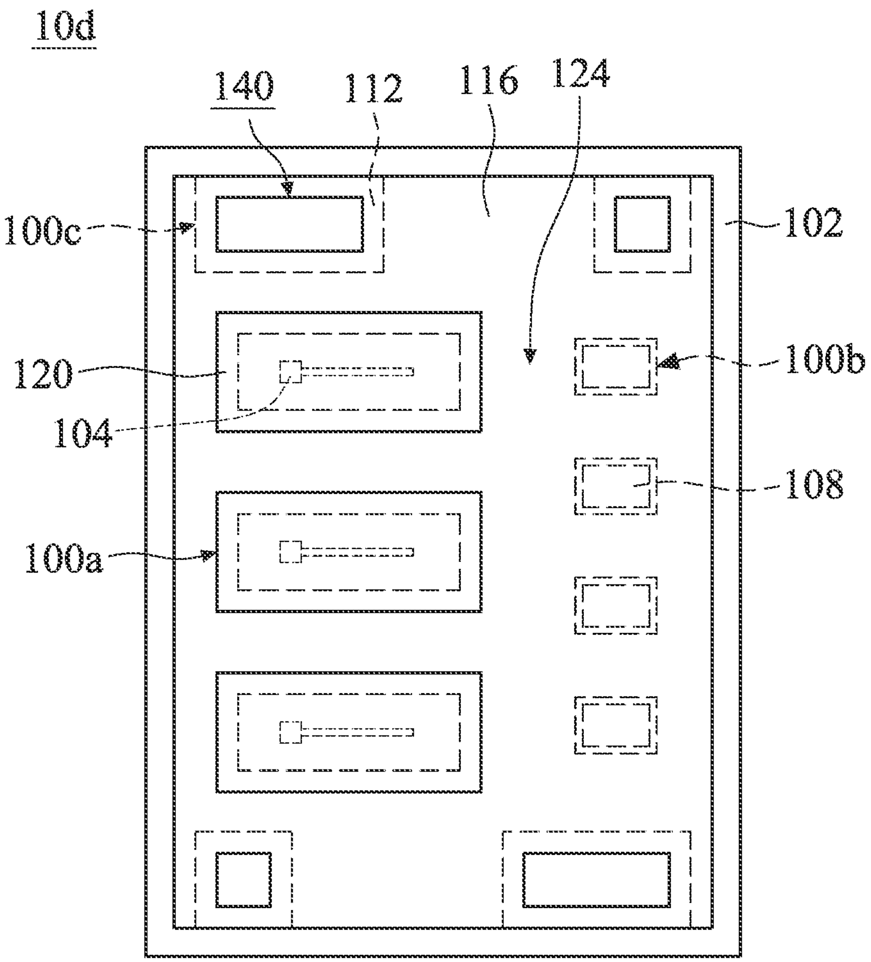
FIG. 8 is a top view of a semiconductor chip in accordance with some embodiments.

FIG. 8 is a top view of a semiconductor chip 10*d* in accordance with some embodiments. In some embodiments as shown in FIG. 8, the ceiling layer 120 only covers the active devices 100*a*, and the barrier structure 116 formed over the passive devices 100*b* and the pad structure 100*c* is exposed, which may reduce wafer warpage compared to the case in which the ceiling layer 120 completely covers the barrier structure 116.

With the ceiling layer 120 of the shielding structure 122 has an opening 124 exposing the barrier structure 116 of the shielding structure 122 over the passive devices 100*b*, the wafer warpage may be reduced. The passivation layer 114 may be defined by using the ceiling layer 120 and the barrier structure 116 as a mask layer. In addition, with a compensating layer 132 located in the metal stack 128, the stress produced by the shielding structure 122 may be compensated for, and the wafer warpage may be further reduced. The pad structure 112 may be partially covered by the barrier structure 116, which may protect the pad structure 112 from moisture. The barrier structure 116 covering the pad structure 112 may be exposed to improve the wafer warpage issue.

As mentioned above, in the present disclosure, a semiconductor chip and a method of forming a semiconductor chip is provided. With the ceiling layer only partially covers the barrier structure in the shielding structure, the volume of the shielding structure may be reduced, and the wafer warpage issue may be improved. The passivation layer covering the devices is defined using the shielding structure as a mask layer. In addition, forming a back side metal stack layer with a compensating layer may also compensate the stress caused by the shielding structure.

It should be noted that although some of the benefits and effects are described in the embodiments above, not every embodiment needs to achieve all the benefits and effects.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor chip, comprising:

an active device formed over a substrate;

a passive device formed over the substrate;

a passivation layer covering the active device and the passive device;

a barrier structure surrounding the active device in top view, wherein a thickness of the barrier structure is greater than a height of the passive device to fill a space around the passive device; and a ceiling layer suspended on the barrier structure over the active device, wherein a first opening is disposed in the ceiling layer and penetrates through the ceiling layer, wherein the barrier structure covers the passive device, and the barrier structure over the passive device is exposed in the first opening.

2. The semiconductor chip as claimed in claim 1, further comprising:

a pad structure formed over the substrate, wherein the pad structure is exposed from the barrier structure and the ceiling layer.

3. The semiconductor chip as claimed in claim 1, wherein the passive device comprises a capacitor.

4. The semiconductor chip as claimed in claim 1, wherein a pattern of the passivation layer is defined by a pattern of the barrier structure and a pattern of the ceiling layer.

5. The semiconductor chip as claimed in claim 1, further comprising:

a metal layer stack formed under the substrate protruding in the substrate.

6. The semiconductor chip as claimed in claim 5, wherein the metal layer stack comprises a TiW layer sandwiched between metal layers.

7. The semiconductor chip as claimed in claim 5, wherein a ratio of a thickness of the metal layer stack to a thickness of the barrier structure is in a range of about 2 to about 20.

8. The semiconductor chip as claimed in claim 1, wherein a ratio of an area of the ceiling layer to an area of the semiconductor chip is in a range of about 2 to about 50.

9. The semiconductor chip as claimed in claim 1, wherein the passive device is exposed from the barrier structure.

10. The semiconductor chip as claimed in claim 1, wherein a bottom surface of the barrier structure is higher than a bottom surface of the passive device.

11. The semiconductor chip as claimed in claim 1, wherein a second opening is under a bottommost surface of the ceiling layer and surrounded by the barrier structure, and at least a portion of the active device is disposed in the second opening.

12. A semiconductor chip, comprising:

an active device formed over a substrate;

a passive device formed over the substrate beside the active device;

a passivation layer formed over the active device and the passive device;

a barrier structure surrounding the active device and covering the passive device in top view, wherein a thickness of the barrier structure exceeds a height of the passive device, thereby occupying a space adjacent to the passive device; and a ceiling layer formed over the active device and the barrier structure, wherein a ratio of an area of the ceiling layer to an area of the semiconductor chip is in a range of about 2 to about 50, wherein the barrier structure is in direct contact with a top surface of the passive device, and the barrier structure over the passive device is exposed.

13. The semiconductor chip as claimed in claim 12, wherein the projection of the passivation layer on the substrate overlaps the projection of the barrier structure and the ceiling layer on the substrate from a top view.

14. The semiconductor chip as claimed in claim 12, wherein the barrier structure comprises a first portion covered by the ceiling layer and a second portion covering the passive device, wherein the first portion and the second portion of the barrier structure are separated from each other.

15. The semiconductor chip as claimed in claim 12, wherein a ratio of an area of the ceiling layer to an area of the barrier structure is in a range of about 2 to about 20.

16. The semiconductor chip as claimed in claim 12, further comprising:

a metal layer stack formed under the substrate, wherein the metal layer stack is in direct contact with the active device.

17. The semiconductor chip as claimed in claim 12, wherein a top surface of the barrier structure covering the passive device is partially exposed from the ceiling layer.

18. A semiconductor chip, comprising:

an active device, a passive device, and a pad structure formed over a substrate;

a barrier structure surrounding the active device in top view, wherein the barrier structure has a thickness greater than a height of the passive device such that it fills a region surrounding the passive device;

a ceiling layer formed directly above the active device and over the barrier structure; and a via structure comprising a metal stack formed in the substrate, wherein the metal stack is conformally formed under the substrate, wherein the barrier structure covers sidewalls and a top surface of the passive device, and the barrier structure over the passive device is exposed in an opening through the ceiling layer.

19. The semiconductor chip as claimed in claim 18, further comprising:

a passivation layer covered by the barrier structure and the ceiling layer, wherein the passivation layer is separated from the ceiling layer.

20. The semiconductor chip as claimed in claim 18, wherein the pad structure is partially covered by the barrier structure.

* * * * *